United States Patent [19]

Faris

[11] 4,274,015
[45] Jun. 16, 1981

[54] SELF-RESETTING JOSEPHSON DIGITAL CURRENT AMPLIFIER

[75] Inventor: Sadeg M. Faris, Yorktown Heights, N.Y.

[73] Assignee: International Business Machines Corporation, Armonk, N.Y.

[21] Appl. No.: 974,652

[22] Filed: Dec. 29, 1978

[51] Int. Cl.³ .......................... H03K 5/02; H03K 3/38
[52] U.S. Cl. .................................... 307/264; 307/277; 307/306
[58] Field of Search ................. 307/90, 106, 212, 264, 307/273, 277, 306; 323/44 F; 361/59, 60, 159; 357/5

[56] References Cited

U.S. PATENT DOCUMENTS

| | | | |
|---|---|---|---|
| 3,051,906 | 8/1962 | Haynes | 328/65 X |
| 3,758,795 | 9/1973 | Anacker et al. | 307/306 |
| 3,849,276 | 11/1974 | Greiner | 204/192 |
| 3,898,569 | 8/1975 | Radcliffe | 328/65 X |
| 3,913,120 | 10/1957 | Lahiri | 357/5 |
| 3,978,351 | 8/1976 | Zappe | 307/306 |

OTHER PUBLICATIONS

S. M. Faris, "Current Amplifier with No Multiple Looping of Control Current Line", IBM Technical Disclosure Bulletin, vol. 20, No. 5, Oct. 1977, pp. 2031-2032.

D. J. Herrell, "Josephson Multivibrator and Monostable Circuits", IBM Technical Disclosure Bulletin, vol. 17, No. 10, Mar. 1975, pp. 3082-3083.

*Primary Examiner*—John Zazworsky
*Attorney, Agent, or Firm*—Thomas J. Kilgannon, Jr.

[57] ABSTRACT

A self-resetting digital current amplifier which utilizes Josephson devices is disclosed. The basic circuit includes a pair of switchable Josephson devices connected to each other and with an output load. The first of these devices is switched by a combination of control current and gate current. The second device is switched by a combination of gate current and current applied from an inductance which is connected between the bottom of the first Josephson device and the top of the second Josephson device. The circuit is fed by a single DC source. In the steady state, current flows from the DC source through the first of the Josephson devices to the second of the Josephson devices via the interconnecting inductance and from then back to the DC source. A pair of resistances in series with the second of the Josephson devices cause current to flow in the inductance which, in the steady state, is essentially a short circuit path. In the dynamic state, a control signal on the first of the Josephson devices in the presence of the gate current causes that device to switch diverting the gate current into the second Josephson device. When the first Josephson device switches, the inductance experiences a high rate of change of current and, in effect, acts as a second current source feeding the second of the Josephson devices along with the diverted gate current. The combination of these currents exceeds the threshold of the second Josephson device causing it to switch instantaneously and deliver the combined current to a load circuit. Any number of additional inductances and current switched Josephson devices may precede the load circuit and amplification is achieved which is a function of the number of inductances acting as current sources. The circuit is self-resetting because it has only one external source. Resetting of the circuit can be independent of the value of load impedance and, as such, can feed current to a high load impedance without sacrificing the ability to be self-resetting. In another embodiment, a plurality of cascaded circuits may be connected in parallel to feed a single load circuit with an extremely high current pulse. The use of delayed triggering and current cancellation can also provide extremely narrow high current pulses. Because of the self-resetting feature, repetition rates in the picosecond range are also achievable.

27 Claims, 4 Drawing Figures

SELF-RESETTING JOSEPHSON DIGITAL CURRENT AMPLIFIER

DESCRIPTION

1. Technical Field

This invention relates to digital current amplifiers and more particularly relates to circuits which utilize Josephson junction devices which are capable of being self-resetting independently of the value of impedance of an associated load circuit. The circuit is adapted to operate in a cryogenic environment. The Josephson devices utilized may be multijunction Josephson interferometers which are compatible with both logic and memory circuits which use similar devices as their switchable elements.

2. Background Art

Current amplification using Josephson junctions to divert current established in a plurality of current paths to a load is already well known. An example of such a circuit is shown in IBM Technical Disclosure Bulletin, Volume 20, No. 5, October 1977, Page 2031 in an article entitled "Current Amplifier With No Multiple Looping of Control Current Line" in the name of S. M. Faris. In the operation of this circuit, a single current source is utilized which must be capable of applying the sum of all gate currents in a plurality of branches which are in parallel with the current source. The current applied is distributed in the various branches in proportion to the resistance of an individual branch. Josephson devices are also disposed in each branch. The Josephson device of the first branch is switched by a control current while the Josephson devices in the remaining branches are switched when their thresholds are exceeded. When the first of the Josephson devices is switched, current is diverted into a succeeding branch where the current in that branch in combination with the current diverted from the first branch causes the Josephson device of that branch to switch. The switching of the succeeding Josephson device in turn causes the Josephson device of the next branch to switch and so on until finally all the diverted currents from the now switched branches are delivered to a load. The operation of this sort of amplifier relies on total transfer of the gate current to a load.

IBM Technical Disclosure Bulletin, Volume 17, No. 10, March, 1975, Page 3082 in an article entitled "Josephson Multivibrator and Monostable Circuits" by D. J. Herrell, shows in FIG. 1 a pair of Josephson devices; one of which is electromagnetically controlled and shunted by an inductance and a resistance. To the extent that the circuit of the above-cited reference employs two Josephson junctions and an inductance and a resistance in parallel with them, the circuit resembles the circuit of the present disclosure superficially. The operation is entirely different and, in the final analysis, requires an L/R circuit rather than the pure inductance of the present application which, in effect, becomes a current source upon switching of a preceding Josephson device. In the circuits of the present application, a single current source provides a single value of gate current which, in the steady state, flows through all of the Josephson devices and the associated inductances. This should be clear from the fact that, regardless of the number of Josephson devices and inductors, in the steady state, a series path which includes the inductors and Josephson devices is provided. Switching of any Josephson device, in effect, places an inductor in parallel with the gate current such that the sum of these currents is fed to a succeeding Josephson device. In this manner, amplification of the input signal is obtained which is a function of the number of inductors which can be placed in parallel, one after the other, with the DC current source. In addition, after the pulse has been delivered to a load circuit, the overall circuit is self-resetting in a manner which is a function of either the value of the load impedance or in a manner which is independent of the value of the load impedance. Accordingly, it is a principle object of the present invention to provide a digital amplifier circuit which has high gain.

It is another object of the present invention to provide a digital amplifier circuit which utilizes only a single power source.

It is another object of the present invention to provide an amplifier circuit which is self-resetting.

Still another object is to provide an amplifier circuit the resettability of which can be independent of the value of output impedance.

Yet another object of the present invention is to provide an amplifier circuit which is self-resetting while simultaneously providing a high output impedance.

BRIEF SUMMARY OF THE INVENTION

The self-resetting, digital current amplifier of the present invention, in a preferred embodiment, utilizes Josephson junction devices which are operable in a liquid helium environment. The preferred basic circuit shows a pair of Josephson junction devices connected to each other and with an output load. The first of these devices can be switched by a combination of control current and gate current. The other device is switched by a combination of gate current and current supplied from an inductor which is connected between the bottom of one Josephson device and the top of the next Josephson device. This connection, in the steady state, provides a series current path from a DC source through the first of the Josephson devices, the inductor, the second of the Josephson devices and a return path to the DC source. A pair of resistors which are disposed in series with the second of the Josephson devices, provide relatively high impedance paths to the gate current in the steady state thereby preventing current flow in these resistors. When control current is applied to the first of the Josephson devices which is preferably an interferometer, the device switches diverting the gate current into the next Josephson device. When the first Josephson device switches, gate current is diverted into the second Joesphson device. The inductor experiences a high rate of change of current but without a significant change in stored current flow, as is well known. The current stored in the inductor passes through the second Josephson device along with the diverted gate current. The combination of these currents exceeds the threshold of the second Josephson device causing it to switch and deliver the combined current to a load circuit. This load circuit may be high impedance and, regardless of this fact, the Josephson devices are self-resetting. Alternatively, the load impedance may be a low impedance and have control over the resetting of the Josephson devices. Apart from this, the resistors disposed in series with the second of the Josephson devices may be of such value as to control the self-resetting of each of the Josephson devices when the circuit is in a dynamic state. Any number of stages may precede the load and amplification is achieved which is a function of the number of inductors present. The circuits have a gain of the number of inductors times the gate current divided by the control signal on the first of the Josephson devices and the resulting power dissipation is extremely low.

These and other objects, features and advantages will be more apparent from the following more particular description of the preferred embodiments.

BRIEF DESCRIPTION OF THE DRAWINGS

In FIG. 1, when the first of a pair of Josephson junction devices is switched, energy stored in an inductance is delivered to a second Josephson device causing it to switch and divert the initial input current plus the current stored in the inductance to a load.

DETAILED DESCRIPTION OF THE PREFERRED EMBODIMENTS

Figure 1:
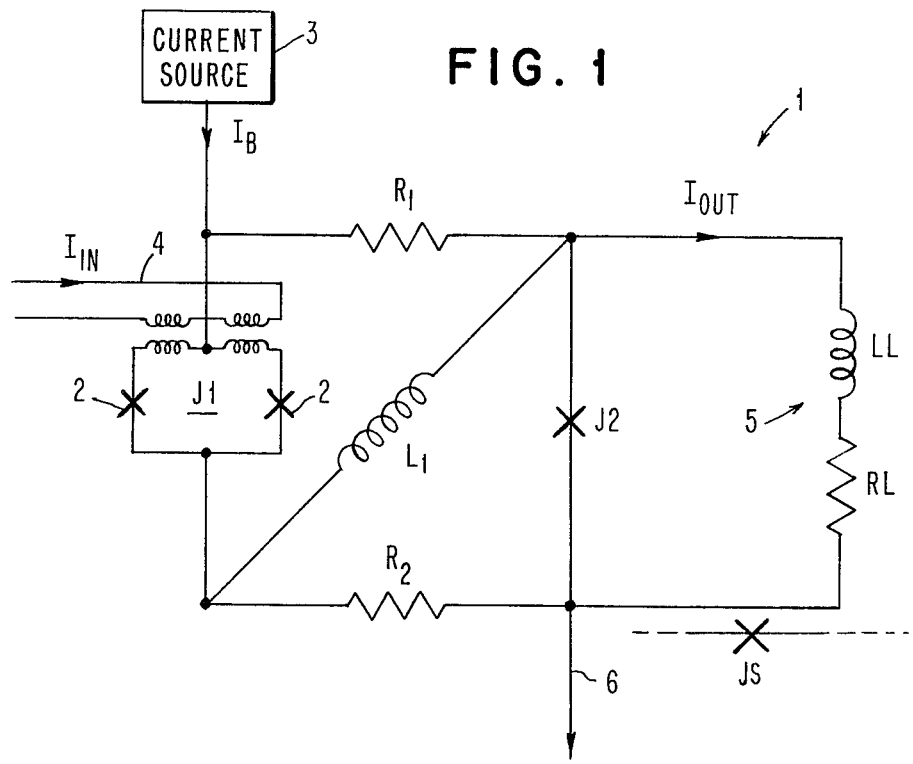
FIG. 1 is a schematic diagram of a self-resetting, digital current amplifier which, in accordance with the teaching of the present invention, is capable of providing a high amplitude current pulse of picoseconds duration.

Referring now to FIG. 1, there is shown therein a schematic diagram of a self-resetting, digital current amplifier 1 which provides a high current, extremely short duration pulse at an output. Current amplifier 1 includes an interferometer device J1 which is capable of carrying Josephson current. Interferometer device J1 is a symmetrically fed two-junction device well known to those skilled in the Josephson art. The junctions of interferometer device J1 are otherwise identified in FIG. 1 by the reference number 2. Device J1 is characterized as an interferometer but any Josephson device capable of carrying Josephson current, as is well known, would be suitable in amplifier circuit 1. Size and gain considerations, however, make interferometer devices the preferred devices for use in the basic circuit of FIG. 1. Interferometer device J1 is disposed in series with a current source 3 otherwise identified in FIG. 1 by the legend CURRENT SOURCE. Current source 3 provides current $I_B$ as gate current to device J1. A control line 4 which is disposed in electromagnetically coupled relationship with interferometer device J1 provides a control current $I_{IN}$ which lowers the threshold of device J1 causing it to switch from the zero voltage state to the voltage state when control current is applied to control line 4.

In FIG. 1, a Josephson device J2 is shown electrically connected with device J1. Devices J1 J2 may be any well-known devices capable of carrying Josephson current which switches from the zero voltage state to the voltage state when the current through it exceeds a threshold current $I_O$. A resister $R_1$ and an inductor $L_1$ are shown disposed in series with each other and in parallel with interferometer device J1. A reactor R2 and device J2 are shown in FIG. 1 connected in series with each other and in parallel with inductor $L_2$. As will be seen hereinafter, in the steady state, inductor $L_1$ effectively short circuits resistors $R_1$, $R_2$. A load circuit 5 consisting of a resistance RL and a serially disposed inductor LL is disposed in parallel with device J2 and carries a current $I_{OUT}$ when circuit 1 is operating dynamically. Finally, an interconnection 6 completes a circuit path consisting of current source 3, device J1, inductor $L_1$ and device J2 when circuit 1 is in a steady state condition.

Figure 2:
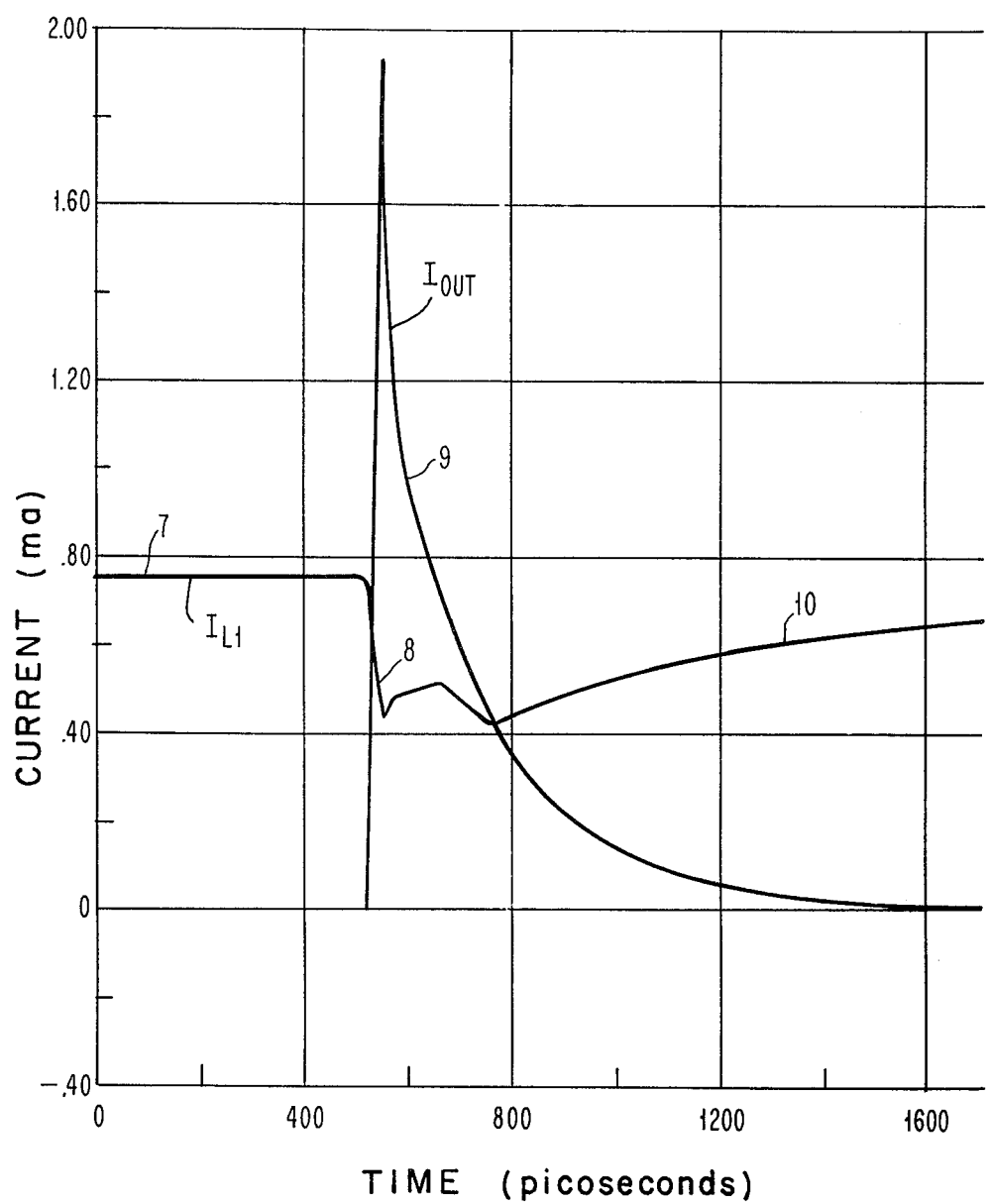
FIG. 2 is a graph of current versus time showing the steady state current flowing in the inductance of FIG. 1 prior to switching and further showing the output current pulse and its subsequent decay to zero after self-resetting takes place.

Referring now to FIGS. 1 and 2, the latter is a graphical representation of current versus time of the current flowing in inductor $L_1$ and the output current, $I_{OUT}$, flowing in load circuit 5 after devices J1, J2 have switched to the voltage state. In operation, current amplifier circuit 1 achieves a steady state condition by applying gate current, $I_B$, from current source 3 to interferometer device J1. Gate current, $I_B$, has a magnitude which is insufficient to switch interferometer device J1 and initially flows preferentially in that device due to the presence of resistance $R_1$. It should be recalled, at this point, that Josephson devices operating at liquid helium temperatures (4.2° K.) permit current to flow therein in one tunneling mode with no voltage drop and in another tunneling mode with a voltage drop. These states are called the zero voltage and voltage states, respectively, and can represent, as is well known, two binary logic states. Thus, gate current $I_B$ flows in interferometer device J1 where it encounters resistor $R_2$ which provides a higher resistance path to current flow than inductor $L_1$. Gate current, $I_B$, therefore, preferentially flows in inductor $L_1$ and from thence via device J2 and interconnection 6 to the return side (not shown) of current source 3. Device J2 which is in its zero voltage state remains in that state because its threshold current, $I_O$, is not exceeded by gate current $I_B$. Device J2 represents a preferred path relative to load circuit 5 because it is in effect a short circuit when device J2 is in its zero voltage state. At this point, no current is flowing in load circuit 5 and steady state current shown in FIG. 2 at portion 7 of the curve otherwise identified in FIG. 2 as $I_{L1}$ is flowing in device J1, inductor $L_1$, device J2 and interconnection 6. Current $I_{L1}$ is equal, at this point, to gate current $I_B$.

Once the steady state condition has been achieved, current amplifier circuit 1 is ready to deliver a high amplitude current pulse to load circuit 5 when circuit 1 is activated by the application of control current $I_{IN}$ on control line 4 of FIG. 1. When control current $I_{IN}$ is applied, the magnetic field generated by this curent lowers the threshold of device J1 and device J1 immediately switches to its voltage state providing a higher resistance path to gate current, $I_B$, than resistor $R_1$ and causing gate current, $I_B$, to be diverted into resistor $R_1$ and from thence via device J2 and interconnection 6 back to current source 3. At this juncture, however, inductor $L_1$ experiences a high rate of change of current flow therein and, in effect, becomes a current source which feeds a current pulse into device J2 along with gate current, $I_B$, which was diverted upon the switching of interferometer device J1. Portion 8 of waveform $I_{L1}$ shows the high rate of change of current in inductor $L_1$. Current consisting of gate current, $I_B$ and the high current generated inductively in inductor L1 now attempts to return to current source 3 via unswitched device J2 and interconnection 6. The threshold current of device J2 is, however, instantaneously exceeded and device J2 switches to its voltage state diverting the currents provided by current source 3 and inductor $L_1$ into load circuit 5 as current $I_{OUT}$. The latter has a waveform identified by that caption in FIG. 2. As indicated by the time scale of FIG. 2, switching and diverting of the current occur so rapidly that the waveform $I_{OUT}$, representing the sum of the currents due to current source 3 and inductor $L_1$ flows instantaneously in device J2 which, in turn, switches instantaneously delivering the current $I_{OUT}$ having the same waveform to load circuit 5.

When inductor $L_1$ experiences the high rate of change of current as indicated by portion 8 of waveform $I_{L1}$ in FIG. 2, it acts as a current source and the current generated flows in the circuit path formed by inductor $L_1$ device J2 and resistor $R_2$. After device J2 switches to its voltage state and current is delivered to load circuit 5, current $I_{OUT}$ decays back to zero with a time constant, L/R, which is a function of the values of the elements LL and RL of load circuit 5. The current pulse $I_{OUT}$ has an exceedingly fast rise time and achieves an amplitude which, depending on the circuit parameters, is more than twice as great as the amplitude of the steady state current in current amplifier circuit 1. Circuit 1 is ideal for digital applications which require high current pulses to trigger succeeding circuits. For example, the magnetic field due to current $I_{OUT}$ in load circuit 5 may be used to trigger another Josephson device J5 which is shown disposed in electromagnetically coupled relationship with output circuit 5 in FIG. 1. Device J5, of course, has its own gate current (not shown) flowing therein but its current source and supporting circuitry are so well known that, for purposes of simplification, they have not been shown. In FIG. 2, portion 10 of waveform $I_{L1}$ indicates that circuit 1 of FIG. 1 can return to its steady state conditions relatively rapidly clearly indicating that reasonably high repetition rates can be achieved with little difficulty.

Thus far, nothing has been said about the resetting of devices J1, J2. The resetting to the zero voltage state of devices J1, J2 can be a function of the values of resistors $R_1$, $R_2$ or can be a function of the value of resistance RL. In connection with device J1, when gate current $I_B$ is diverted into resistor $R_1$ when device J1 switches, if the resulting voltage drop is less than the minimum voltage drop ($V_{min}$) device J1 will instantly reset to its zero voltage state and be in readiness to accept gate current flow therein as current $I_{L1}$ returns to the circuit path consisting of current source 3, device J1, inductor $L_1$, device J2 and interconnection 6. Similarly, device J2 can be reset to the zero voltage state as long as the voltage drop in resistor $R_2$ is less than the minimum voltage ($V_{min}$) of device J2. From this, it may be seen that the resetting of devices J1, J2 is independent of the value of the load resistance RL. This permits a designer to provide a current into a high output impedance while still retaining the ability to have the Josephson devices of the circuit self-resetting. This feature of circuit 1 of FIG. 1 is a particularly attractive one in that it has not been possible heretofore to achieve self-resetting of the Josephson devices of a circuit and still have the luxury of feeding a high impedance load. Alternatively, of course, load RL may be of low impedance without departing from the self-resetting aspects described hereinabove. Indeed, the voltage drops across resistors $R_1$, $R_2$ can be greater than the minimum voltage and the overall circuit can be reset as a result of the voltage drop across load resistor RL being less than the minimum voltage of devices J1, J2. In FIG. 1 inductor LL represents the inductance of the load circuit which may include inductances such as crossing inductance when output circuit 5 is utilized to control the switching of a succeeding Josephson device. While it has not been mentioned heretofore, amplifier circuit 1 of FIG. 1 is operated at liquid helium temperatures (4.2° K.) and the various circuit portions with the exception of the resistors of FIG. 1 are made of materials which are superconducting at the temperature of operation.

The elements of circuit 1 of FIG. 1 used to obtain the waveforms of FIG. 1 are as follows:

$I_B = 0.75$ mA
$I_{IN} = 0.75$ mA
$I_O$ of each of junctions 2 of interferometer J1 = 0.5 mA
$I_O$ of J2 = 1 mA
$R_1 = R_2 = 0.4$ ohm
RL = 0.1 ohm
$L_1 = 150$ pH
$L_L = 20$ pH
Branch inductances of device J1 are each equal to 0.5 pH The circuit described hereinabove is self-resetting because it has only one external source. The self-resetting circuit of FIG. 1 has a gain $nI_B/I_N$ where n is the number of current storing inductors $L_1$. Using the parameters outlined hereinabove results in a gain of 2.6 where the number of current storing elements is equal to 1. In this example, an additional gain is provided by underdamped current transfer to the load.

Figure 3:
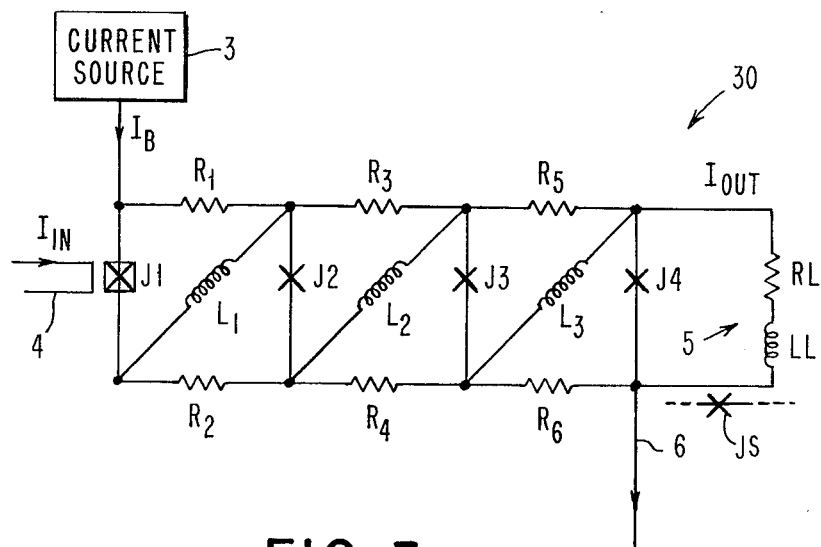
FIG. 3 is a schematic diagram of a plurality of circuits of the type shown in FIG. 1 cascaded to provide an output current which is proportional to the current gain provided by one circuit times the number of cascaded circuits.

Referring now to FIG. 3, there is shown therein a schematic circuit 30 similar to that shown in FIG. 1 except that a plurality of inductors $L_1$-$L_3$ and Josephson devices J2-J4 are cascaded to provide a circuit which has the gain of the circuit of FIG. 1 times the number of inductors which, in the instance of FIG. 3, number three. Where the elements in FIG. 3 are the same as the elements shown in FIG. 1, the elements in FIG. 3 have been given the same reference characters. In FIG. 3, resistors $R_3$-$R_6$ are identical with resistor $R_1$. Similarly, devices J3, J4 are identical with device J2. In like manner, inductors $L_2$, $L_3$ are identical with inductor $L_1$. Load circuit 5 is the same as load circuit 5 of FIG. 1.

In operation, circuit 30 operates in the same manner as described in connection with the circuit of FIG. 1. However, when device J2 of circuit 30 switches, it does not deliver current to load circuit 5 but rather delivers the resulting current to device J3 which switches when inductor $L_2$ acts as a current source. When device J3 switches, all the current delivered to device J3 is delivered to device J4 along with that provided by inductor $L_3$ when it acts as a current source in a manner similar to that described in connection with inductor L1 of FIG. 1. Finally, when device J4 switches, it delivers a current $I_{OUT}$ to a load RL which is three times that obtainable when a single inductor is used as a current source. From the foregoing discussion, it can be seen that inductors and Josephson devices can be cascaded indefinitely to provide extremely high currents to a load circuit. Devices J3, J4 need only have the same threshold current as device J2 inasmuch as, in the steady state, the maximum current flowing through these devices is the gate current $I_B$.

Figure 4:
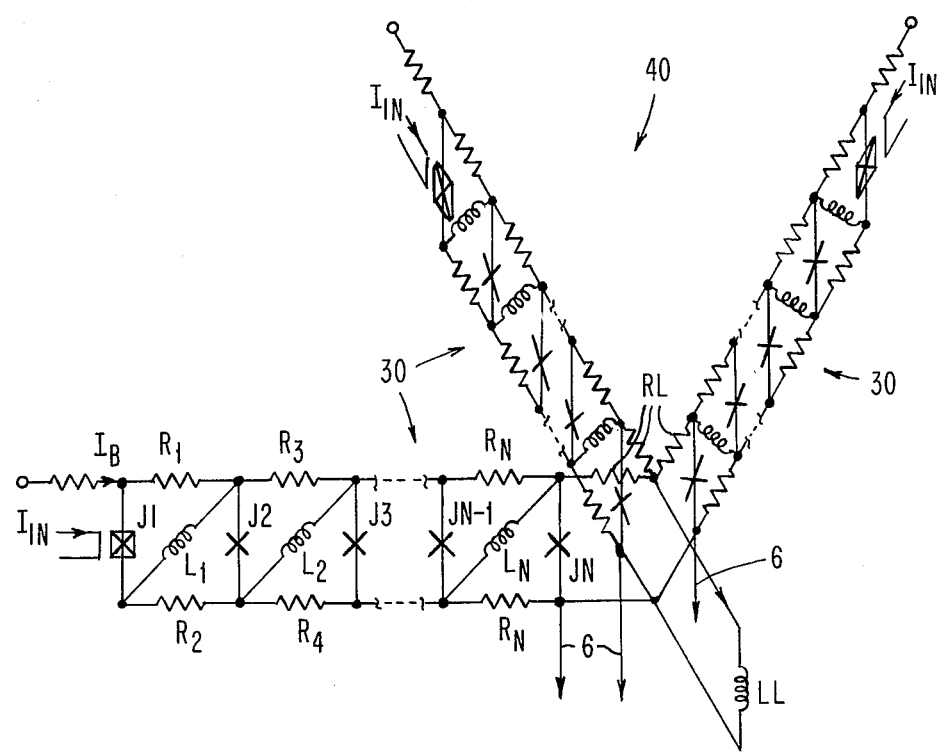
FIG. 4 is a schematic of a plurality of circuits similar to those shown in FIG. 3. The circuit arrangements of FIG. 3 are connected in parallel with a load such that the sum of all the currents can be delivered simultaneously to the load. These circuits can be triggered simultaneously to apply a high peak current to the load or can be triggered to provide a plurality of pulses one after the other to the load. By adjusting current directions and their timing, it is possible to obtain extremely narrow pulses. In addition, logic functions such as AND, OR and NOR can be obtained.

Referring now to FIG. 4, there is shown a schematic diagram of a circuit 40 which includes a plurality of circuits 30 of the kind shown in FIG. 3 connected in parallel with a single load circuit. For simplicity's sake, only one circuit 30 has been labelled to show the relationship of the various elements in FIG. 4. Each of the circuits 30 is substantially identical such that, if each of the devices J1 is pulsed simultaneously by applying $I_{IN}$ on control lines 4, an output will be delivered to load circuit 5 which is the sum of all the outputs of circuits 30. The details of the operation of circuits 30, as has been indicated hereinabove, are the same as those discussed in connection with the operation of FIG. 1. Based on the foregoing, it should be clear that extremely large currents can be delivered to a load simultaneously providing extremely high pulsed magnetic fields which could be utilized for electron beam focusing or nuclear fusion application. Because circuits 30 are triggered separately (either by magnetic fields or by radiation), transmission delays can be taken into account in the separate circuits by advancing or delaying the triggering of devices J1 of circuits 30. Also, it should be appreciated that by adjusting the direction of gate current $I_B$ that oppositely directed current pulses can be delivered to load circuit 5 and that by further adjusting the triggering of each of circuits 30 that extremely narrow pulses, as a result of current cancellation, can be delivered to a load. Again, by adjusting the triggering of circuits 30 in FIG. 4, high amplitude current pulses having a high repetition rate can be delivered to a load with little difficulty.

The Josephson devices discussed in connection with the present invention may be any well-known type of Josephson junction or, as indicated hereinabove, in a preferred embodiment may be multiple junction device known as Josephson junction interferometers. Interferometers of the type shown in U.S. Pat. No. 3,978,351, Ser. No. 592,000, filed June 30, 1975 and assigned to the same assignee as the present invention may be utilized in the practice of the present invention. In addition, all the interconnection circuitry like interconnection lines 6 and control lines 4 are made from materials which are superconductive at the temperature of liquid helium. Typical Josephson junctions and interconnection circuitry which may be utilized in the practice of the present invention are shown in U.S. Pat. No. 3,758,795, Ser. No. 267,841, filed June 30, 1972 and assigned to the same assignee as the present invention. A typical fabrication technique for forming Josephson junction devices is shown in U.S. Pat. No. 3,849,276, Ser. No. 125,993, filed Mar. 19, 1971 which is also assigned to the same assignee as the present invention. Resistances such as $R_1$, $R_2$ which must not be superconductive at the circuit operating temperature may be fabricated with compatible materials which display resistance at the desired operating temperature. U.S. Pat. No. 3,913,120, Ser. No. 429,461, filed Dec. 28, 1973 and assigned to the same assignee as the present invention showing material and method of fabrication of circuitry and a resistor which may be utilized in the practice of the present invention.

Having thus described my invention, what I now claim as new, and desire to secure by letters patent is:

1. A digital current amplifier comprising:
    a current source which provides a given current magnitude,
    a first superconducting switchable device connected to said current source,
    a load circuit, and,
    inductive means interconnecting said current source and said load circuit for applying a current magnitude greater than said given current magnitude to said load circuit, said inductive means including a first resistance and an inductance disposed in series with each other and connected in parallel with said first device, a second superconducting switchable device connected in parallel with said load circuit, a second resistance disposed in series with said second device, the latter and said second resistance being connected in parallel with said inductance.

2. A digital current amplifier according to claim 1 wherein said load circuit includes a load resistor.

3. A digital current amplifier according to claim 1 further including means connected to said first superconducting switchable device for applying an input signal thereto.

4. A digital current amplifier according to claim 1 further including means electrically coupled to said load circuit responsive to said current magnitude greater than said given current magnitude.

5. A digital current amplifier according to claim 1 wherein said first and second superconducting switchable devices are devices capable of carrying Josephson current.

6. A digital current amplifier according to claim 2 wherein said load resistor has a resistance value which is too great to permit self-resetting of said first and second devices.

7. A digital current amplifier according to claim 2 wherein said load resistor has a resistance value which is sufficient to permit self-resetting of said first and second devices.

8. A device current amplifier according to claim 1 wherein said first and second resistances have resistance values which are sufficient to permit self-resetting of said first and second devices, respectively.

9. A digital current amplifier according to claim 3 wherein said means for applying a signal includes a control line disposed in electromagnetically coupled relationship with said first switchable device.

10. A digital current amplifier comprising:
    a plurality of current sources each of which provides a given current magnitude,
    a plurality of first switchable devices capable of carrying Josephson current each one of said plurality of first devices being connected to a respective one of said current sources,
    a load circuit, and,
    a plurality of inductive means interconnecting each of said plurality of current sources with said load circuit for applying a current of magnitude greater that the sum of said given current magnitudes to said load circuit each of said plurality of inductive means including,
    a first resistance and an inductance disposed in series with each other,
    a second switchable device capable of carrying Josephson current and a second resistance disposed in series with each other and in parallel with said inductance, the first of said plurality of inductive means having said first resistance and said inductance thereof connected in parallel with said first device, each succeeding of said inductive means having said first resistance and said inductance thereof connected in parallel with said second device of a preceding inductive means, said load circuit being connected in parallel with said second device of the last of said plurality of inductive means.

11. A digital current amplifier according to claim 10 wherein said load circuit includes a load resistor.

12. A digital current amplifier according to claim 11 further including means for switching each of said first switchable devices from the zero voltage state to the voltage state coupled to said first switchable devices.

13. A digital current amplifier according to claim 12 further including means electrically coupled to said load circuit responsive to said current magnitude greater than said given current magnitude.

14. A digital current amplifier according to claim 11 wherein said load resistor has a resistance value which is sufficient to permit self-resetting of said first and said plurality of second devices.

15. A digital current amplifier according to claim 11 wherein said load resistor has a resistance value which is too great to permit self-resetting of said first and said plurality of second devices.

16. A digital current amplifier according to claim 11 wherein said first and second resistances have resistance values which are sufficient to permit self-resetting of said plurality of first and said plurality of second devices.

17. A digital current amplifier according to claim 12 wherein said means for switching includes a control line disposed in electromagnetically coupled relationship with each of said plurality of first switchable devices.

18. A digital current amplifier according to claim 13 wherein said means responsive to said current magnitude greater than said given current magnitude includes a switchable device capable of carrying Josephson current disposed in electromagnetically coupled relationship with said load circuit.

19. A digital current amplifier comprising:
a current source which provides a given current magnitude,
a first switchable device capable of carrying Josephson current connected to said current source,
a load circuit, and,
a plurality of inductive means interconnecting said current source and said load circuit for applying a current magnitude greater than said given current magnitude to said load circuit, each of said inductive means including,
a first resistance and an inductance disposed in series with each other, a second switchable device capable of carrying Josephson current and a second resistance disposed in series with each other and in parallel with said inductance, the first of said plurality of inductive means having said first resistance and said inductance thereof connected in parallel with said first device, each succeeding of said inductive means having said first resistance and said inductance thereof connected in parallel with said second device of a preceding inductive means, and said load circuit being connected in parallel with said second device of the last of said plurality of inductive means.

20. A digital current amplifier according to claim 19 further including means for switching said first switchable device from the zero voltage state to the voltage state coupled to said first switchable device.

21. A digital current amplifier according to claim 19 further including means electrically coupled to said load circuit responsive to said current magnitude greater than said given current magnitude.

22. A digital current amplifier according to claim 19 wherein said load circuit includes a load resistor.

23. A digital current amplifier according to claim 21 wherein said means responsive to said current magnitude greater than said given current magnitude includes a switchable device capable of carrying Josephson current disposed in electromagnetically coupled relationship with said load circuit.

24. A digital current amplifier according to claim 22 wherein said load resistor has a resistance value which is sufficient to permit self-resetting of said first and said plurality of second devices.

25. A digital current amplifier according to claim 22 wherein said load resistor has a resistance value which is too great to permit self-resetting of said first and said plurality of second devices.

26. A digital current amplifier according to claim 19 wherein said first and second resistances have resistance values which are sufficient to permit self-resetting of said first and said plurality of second devices.

27. A digital current amplifier according to claim 20 wherein said means for switching includes a control line disposed in electromagnetically coupled relationship with said first switchable device.

* * * * *